United States Patent
Barratt et al.

(10) Patent No.: US 6,448,793 B1
(45) Date of Patent: Sep. 10, 2002

(54) ADAPTIVE MANUFACTURING OF SEMICONDUCTOR CIRCUITS

(75) Inventors: Curtis A. Barratt; Jon D. Jorgenson, both of Greensboro; Khoi T. Vu, Jamestown, all of NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/545,128

(22) Filed: Apr. 7, 2000

(51) Int. Cl.⁷ .............................................. G01R 27/08
(52) U.S. Cl. ...................................................... 324/693
(58) Field of Search ...................... 395/500.34; 385/14; 371/27; 438/312, 186, 309

(56) References Cited

U.S. PATENT DOCUMENTS

| | | | | |
|---|---|---|---|---|
| 4,978,923 A | * | 12/1990 | Maltiel | 324/693 |
| 5,535,223 A | * | 7/1996 | Horstmann | 371/27 |
| 5,764,820 A | * | 6/1998 | De Dobbelaere | 385/14 |
| 6,026,230 A | * | 2/2000 | Lin | 395/500.34 |
| 6,051,907 A | | 4/2000 | Ylilammi | 310/312 |
| 6,060,818 A | | 5/2000 | Ruby et al. | 310/363 |

OTHER PUBLICATIONS

Ruegsegger, Steven; Wagner, Aaron; Freudenberg, James S.; and Grimard, Dennis S.; "Feedforward Control for Reduced Run–to–Run Variation in Microelectronics Manufacturing;" *IEEE Transactions on Semiconductor Manufacturing*; vol. 12, No. 4, Nov. 1999.
U.S. application Ser. No. 9026230, Sharon Lin, filed as Feb. 2000.*

* cited by examiner

*Primary Examiner*—John F. Niebling
*Assistant Examiner*—Andre C Stevenson
(74) *Attorney, Agent, or Firm*—Withrow & Terranova, P.L.L.C.

(57) ABSTRACT

The present invention relates to a process for implementing a base circuit design with configurable modifications to compensate for variations in component parameters due to material or processing characteristics. During the fabrication process, the base circuit is electrically tested to determine the characteristics of the base circuit given the materials and processes used to implement the circuit. Based on the testing, subsequent processing steps are used to modify the base circuit as necessary to compensate for variations in the circuit or component parameters due to the material or processing characteristics.

Preferably, the base circuit includes hetero-junction bipolar transistors and the in-process testing is used to determine an associated beta value for the transistor. Based upon the determined beta value, the circuit is modified during processing to insure proper quiescent currents occur during normal operation given the beta of the transistor. Preferably, a top level mask is used to select the resistance in the base current path to select the proper base current for a desired quiescent collector current.

22 Claims, 7 Drawing Sheets

ADAPTIVE MANUFACTURING OF SEMICONDUCTOR CIRCUITS

BACKGROUND OF THE INVENTION

The present invention relates to semiconductor processing, and in particular, adaptive processing to minimize the effect of wafer and processing variations in the final semiconductor circuit.

Natural variations in materials and processing steps cause variations in performance of semiconductor devices. These variations may change drastically from wafer to wafer and lot to lot. In the case of amplifier circuitry incorporating heterojunction bipolar transistors (HBT) formed using a gallium arsenide process, there is significant variation in final circuit performance based on the variations in manufacturing materials. In particular, large variations in beta for each HBT device requires designers to work with similar variations in idle current, gain, power, efficiency and other key parameters bearing directly on performance. Further, large variations in beta result in low manufacturing yields because these variations in beta are often outside of the already excessive tolerances taken into consideration in the circuit design. As such, there is a need for a way to improve manufacturing yields and to compensate for process variations in a cost-effective and time-efficient manner.

SUMMARY OF THE INVENTION

The present invention provides an adaptive manufacturing technique for measuring device parameters at a point in the manufacturing process and for making adjustments during processing to compensate for variation in these parameters. The preferred process reduces the performance variation resulting from variation in transistor beta in power amplifier circuits made from hetero-junction bipolar transistors (HBT).

The process involves using beta values, determined by on-wafer testing at a midpoint in the fabrication process. Typically, testing is done after application of the first interconnect metal layer. The beta value determined from the testing is used to select connection points to a series of resistors used to control the bias currents driving the HBT amplifier circuit. Appropriate connections are made in a subsequent metal layer and optimize bias conditions in the final circuit by compensating for variations in beta. The given device beta and selected bias resistance effectively trims the quiescent current settings and results in much tighter performance tolerances for the final device. Compensating for variations in beta significantly reduces variations in idle current, gain, power, efficiency and other key parameters bearing directly on device performance.

BRIEF DESCRIPTION OF THE DRAWINGS FIGURES

DETAILED DESCRIPTION OF THE PREFERRED EMBODIMENTS

Variations in wafer processing have a negative impact throughout the design, processing and application of the final device. Variation in certain process parameters can be compensated for by changing the nature of subsequent processes, if the parameter can be measured in time for such compensation to be made. The present invention relates to a process that measures and compensates for variable parameters during the manufacturing process.

Figure 1:
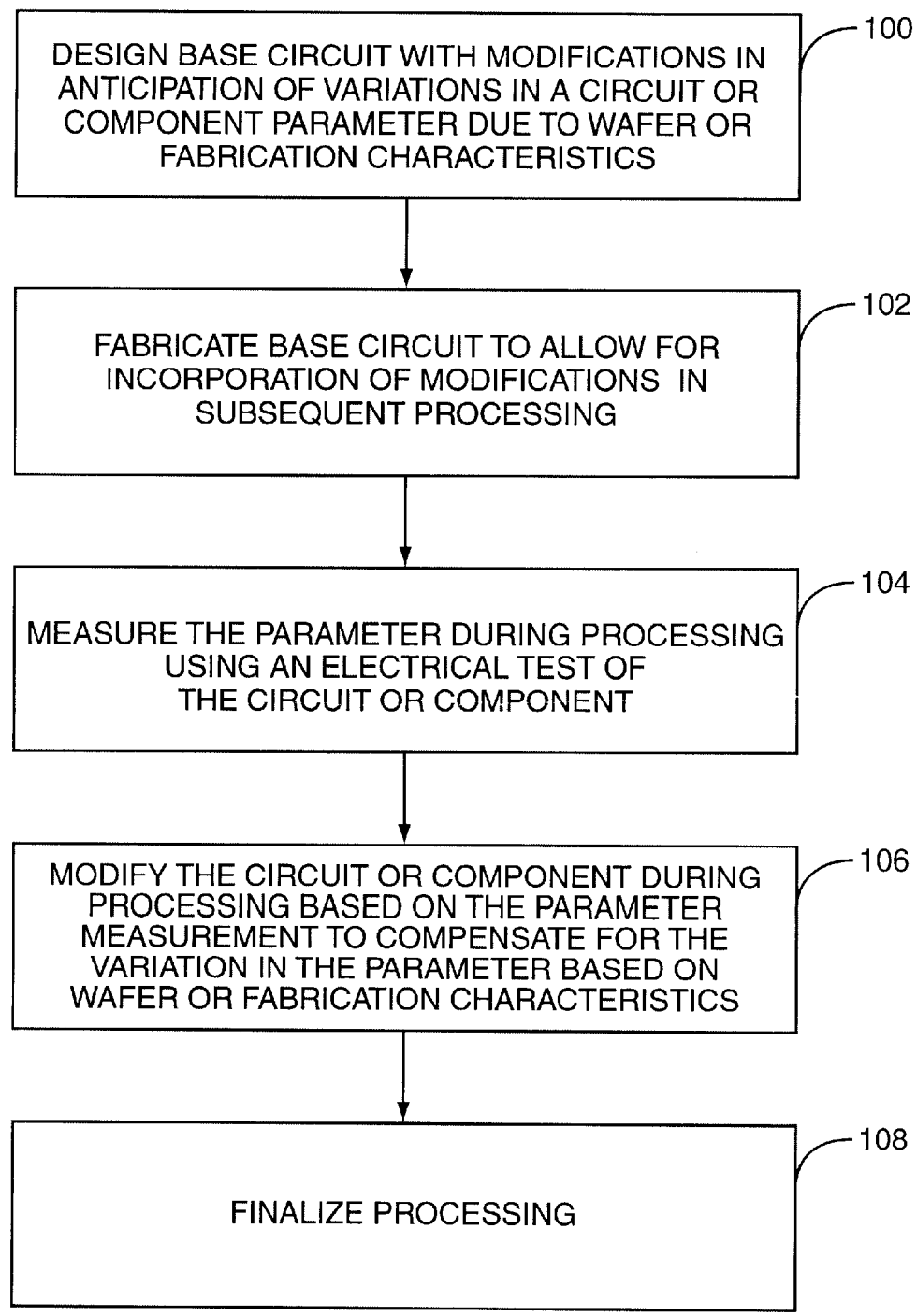
FIG. 1 is a flow chart outlining the basic adaptive manufacturing process of the present invention.
Figure 2:
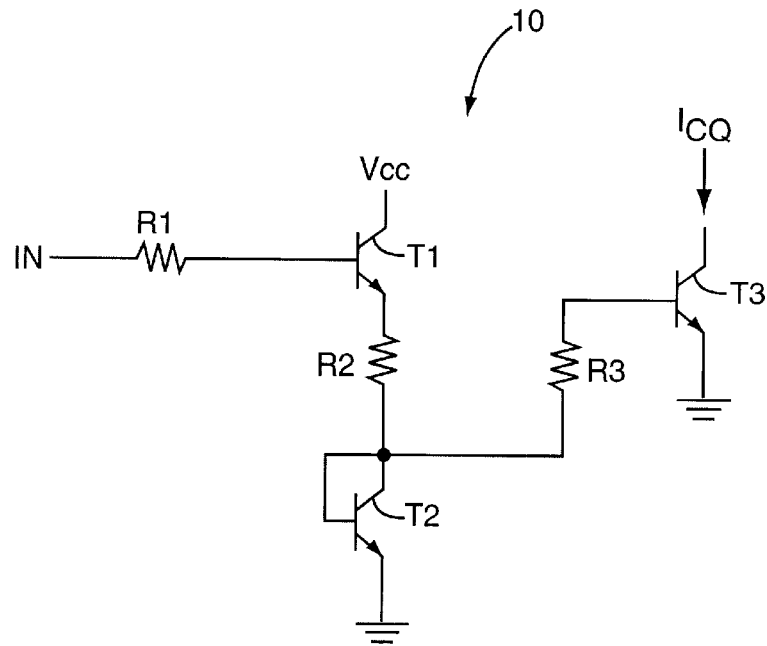
FIG. 2 is a simplified schematic of an amplifier circuit.

The basic manufacturing process according to the present invention is outlined in FIG. 1. Typically, semiconductor circuitry is designed with known process variations in mind. Preferably, a base or primary circuit is designed with one or more modifications configured to compensate for anticipated process variations (block 100). For example, assume the base circuit design is the amplifier circuitry 10 shown in FIG. 2. The circuit includes three hetero-junction bipolar transistors, T1, T2 and T3. The amplifier circuitry 10 also includes resistors R1, R2 and R3, configured to set the base currents and other quiescent currents for the amplifier circuitry 10. Importantly, all of the circuitry shown in FIG. 2 may be implemented in the semiconductor device. Once the semiconductor is manufactured, the values for resistors R1, R2 and R3 are substantially fixed. External components to compensate for variations in device performance are preferably avoided.

Figure 3:
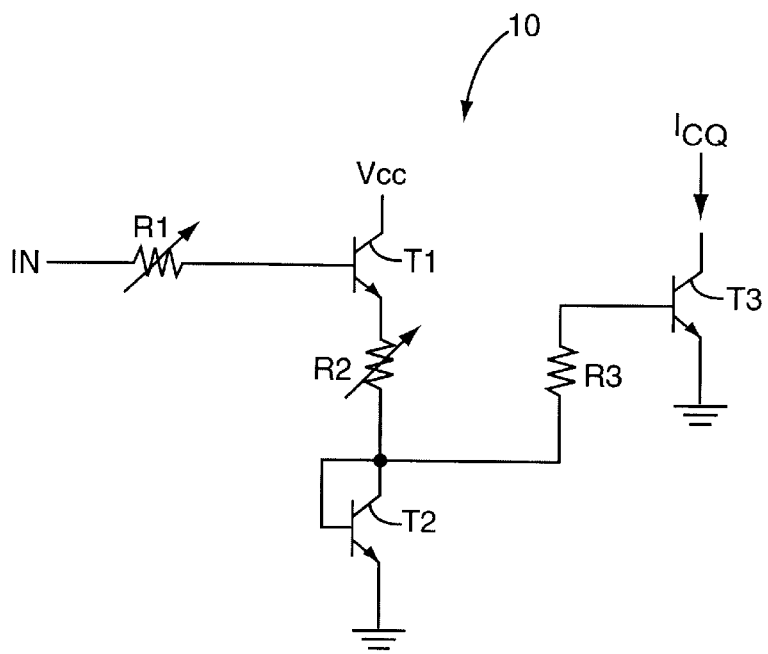
FIG. 3 is a simplified schematic of the amplifier circuit of FIG. 2 with variable resistors used to compensate for variations in beta.

In order to compensate for changes in beta, one would theoretically like to manufacture the device and adjust one or more of the resistors to adjust the base current for the transistors within the amplifier circuitry 10. The variations in beta directly affect the gain of the amplifier circuitry 10, thus, the collector quiescent current $I_{CQ}$ may vary drastically between devices. Without being able to vary one or more of the resistors controlling base currents, such as making resistors R1 and R2 variable as shown in FIG. 3, designers and manufacturers are significantly limited by the excessively wide tolerances of certain semiconductor devices, especially for gallium arsenide hetero-junction bipolar transistors.

Figure 4:
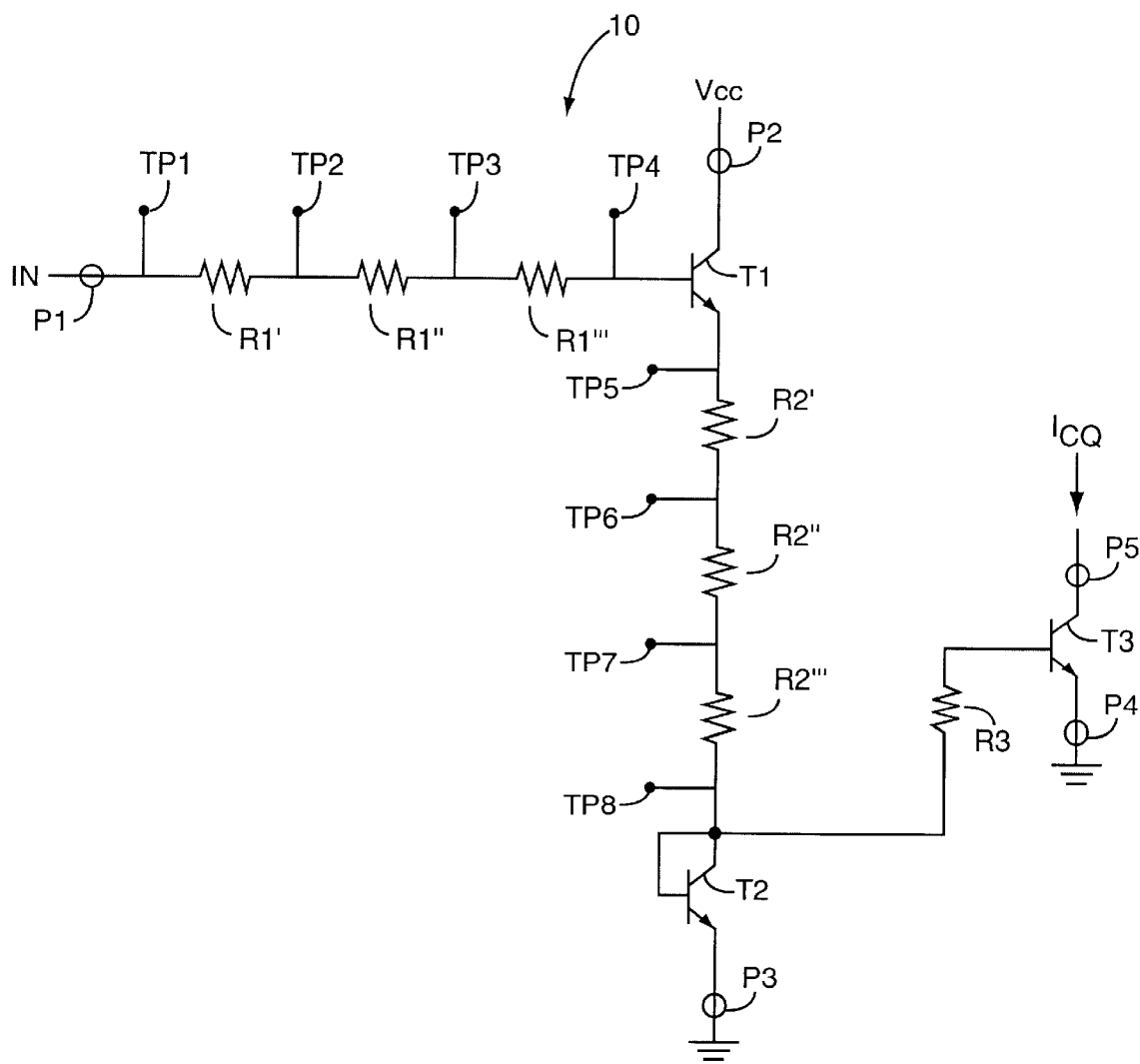
FIG. 4 is a simplified schematic representation of a modification of the amplifier circuitry of FIG. 2 according to a preferred embodiment of the present invention.

Once the base circuit is designed with modifications in anticipation of process variations, the base circuit is fabricated during a semiconductor process to allow for modifications as necessary in subsequent processing (block 102). Continuing with our example amplifier circuitry 10, a representation of a base circuit designed to be modified during processing is shown in FIG. 4. As shown, resistor R1 has been segmented into three resistive elements, R1', R1", and R1'". Similarly, resistor R2 is replaced with three resistive elements, R2', R2", and R2'". Electrical taps are placed at the ends and between the resistive elements. The taps associated with R1', R1" and R1'" are TP1 through TP4. The four taps corresponding to R2', R2" and R2'" are TP5 through TP8. The base circuit is designed to include each of the resistive elements in series. Modifications to the base circuit are made by selectively connecting the taps associated with the resistive elements to control the final base resistance, and thus, base current during operation of the device. Preferably, taps TP1 through TP4 and TP5 through TP8 are used to short resistive elements out of the circuit or to connect a resistive element to another part of the circuit.

During the manufacturing process, once the base circuit design is implemented, an electrical test is conducted during the fabrication process to measure a component or overall circuit parameter. In the present example, connection points P1 through P4 are used to conduct the electrical test. Connection point P1 may be used to introduce an input signal, such as a normalized bias current. Connection point P2 may be connected to a power supply having a voltage $V_{CC}$. Connection points P3 and P4 may be connected to ground, and connection point P5 may be connected to a current source capable of measuring the collector's quiescent current $I_{CQ}$. Based on the measured currents, the beta for the device and circuitry can be determined (block 104).

Continuing with the example, assume that the anticipated variations in beta can be categorized into three ranges associated with a low beta wafer, medium beta wafer and high beta wafer. For each of these three classifications, the resistances for R1 and R2 are selected by modifying the circuit or component during a subsequent processing step to compensate for the variation in the measured parameter (block 106). In particular, the determined beta from the test measurement in the example determines which taps associated with the resistors R1 and R2 are shorted together. For a low beta wafer, higher base currents are necessary to effect a desired collector quiescent current $I_{CQ}$. As such, connections to the taps TP1 through TP4 and TP5 through TP8 are configured to provide low resistance values for R1 and R2. In contrast, for a high beta wafer, lower base currents will result in the desired collector quiescent current $I_{CQ}$. For the medium beta wafer, resistance values for R1 and R2 are selected near a midpoint between those necessary for the low beta and high beta wafers. Taps TP1 through TP4 and TP5 through TP8 are preferably interconnected to short any or all of the resistive elements, R1', R1", R1''', R2', R2" and R2''', to set the resistance values for resistors R1 and R2

Figure 5:
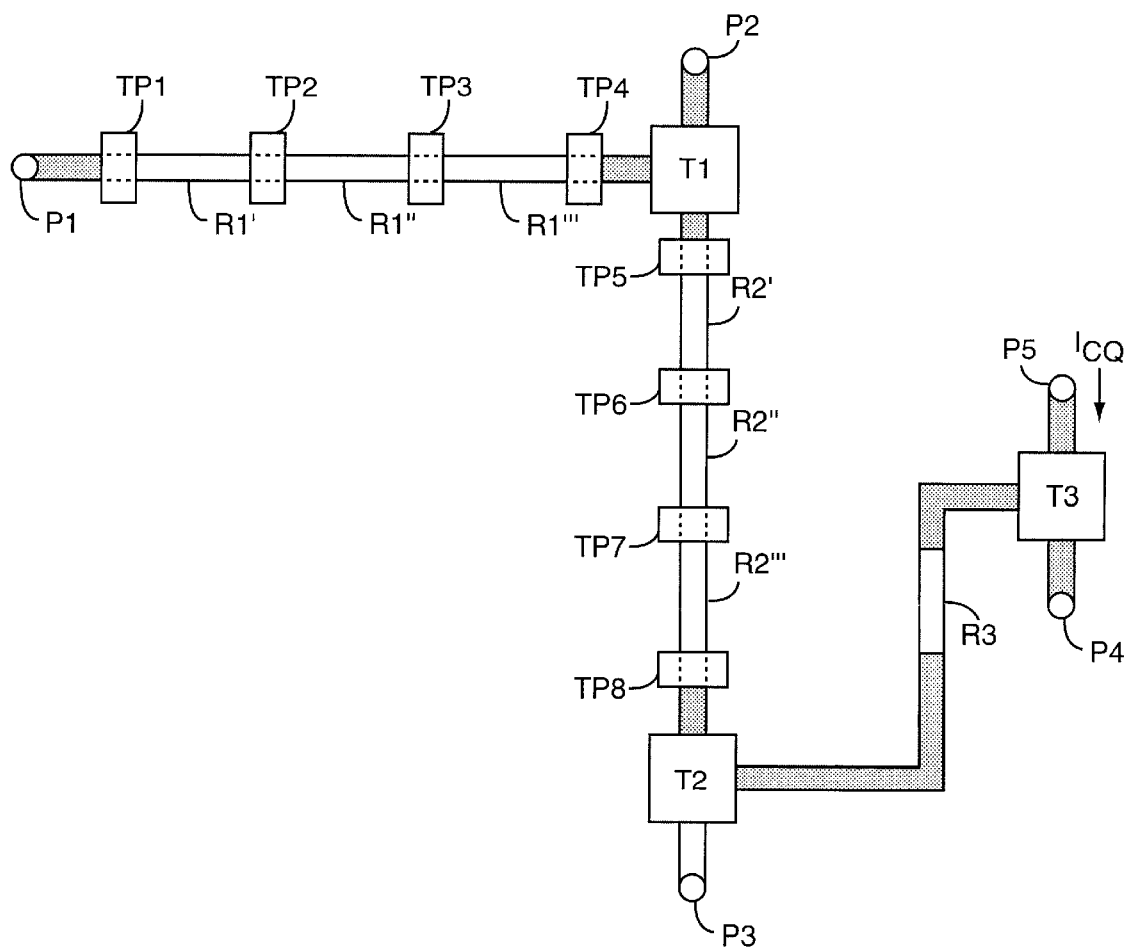
FIG. 5 is a representation of semiconductor elements forming the circuit in the schematic of FIG. 4.
Figure 7:
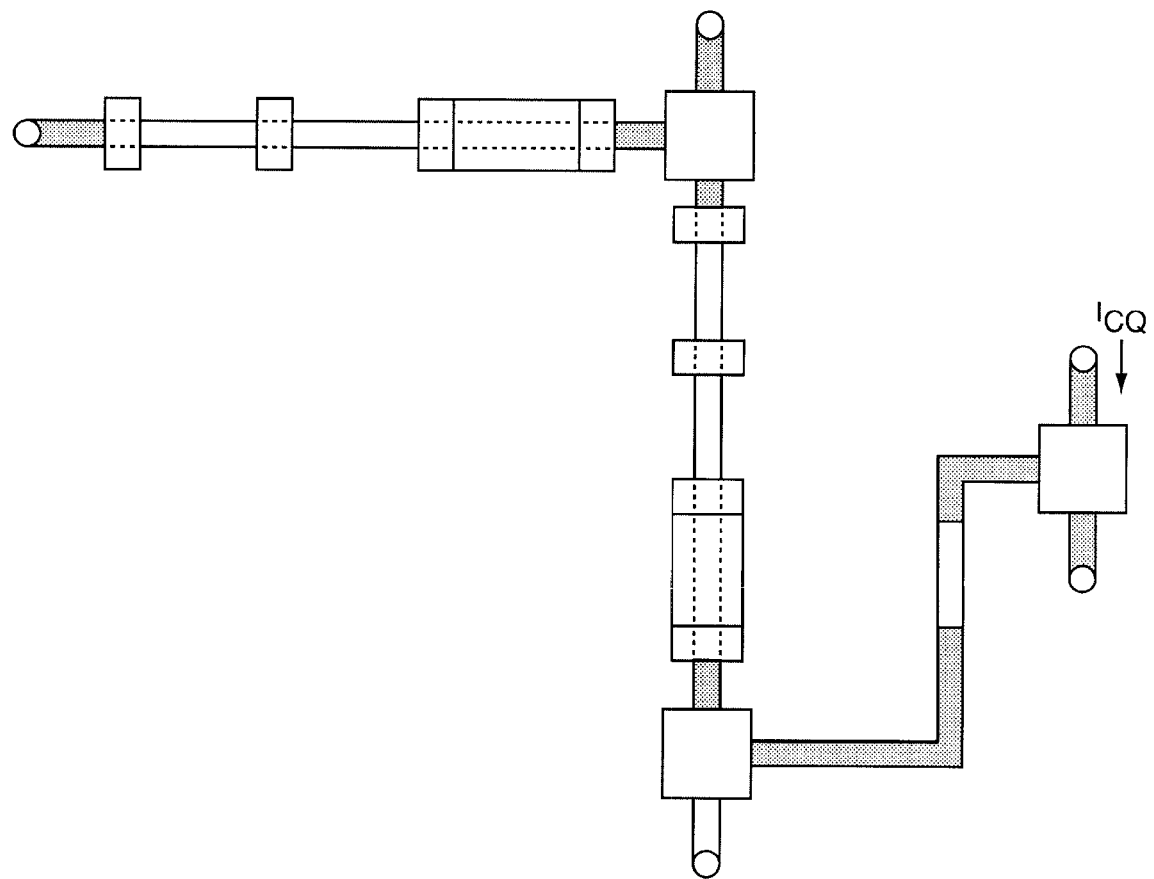
FIG. 7 shows a modification of the semiconductor circuit of FIG. 5 according to a second exemplary embodiment.

FIG. 5 represents the circuitry of FIG. 4 as formed on a semiconductor wafer. Notably, the resistive elements vary in length depending on the desired resistance. Transistors T1, T2 and T3 are shown in block form and metal traces connecting the various elements are shown in darkened lines. The taps TP1 through TP8 are shown as metal posts or pads connecting the various resistive elements to one another and to the metal traces as necessary. For a high beta wafer, none of the taps TP1 through TP4 or TP5 through TP8 are shorted in order to provide maximum resistance for R1 and R2. For a medium beta wafer, the configuration of FIG. 7 is preferable, wherein taps TP1 and TP2 are shorted, and TP7 and TP8 are shorted with a top metal mask (TOPM). In this configuration, the effective value for R1 is the sum of the resistances of resistive elements R1' and R1". R1''' is shorted out of the circuit. Likewise, the effective resistance value for resistor R2 is the sum of resistive elements R2' and R2", wherein R2''' is shorted out of the circuit.

Figure 6:
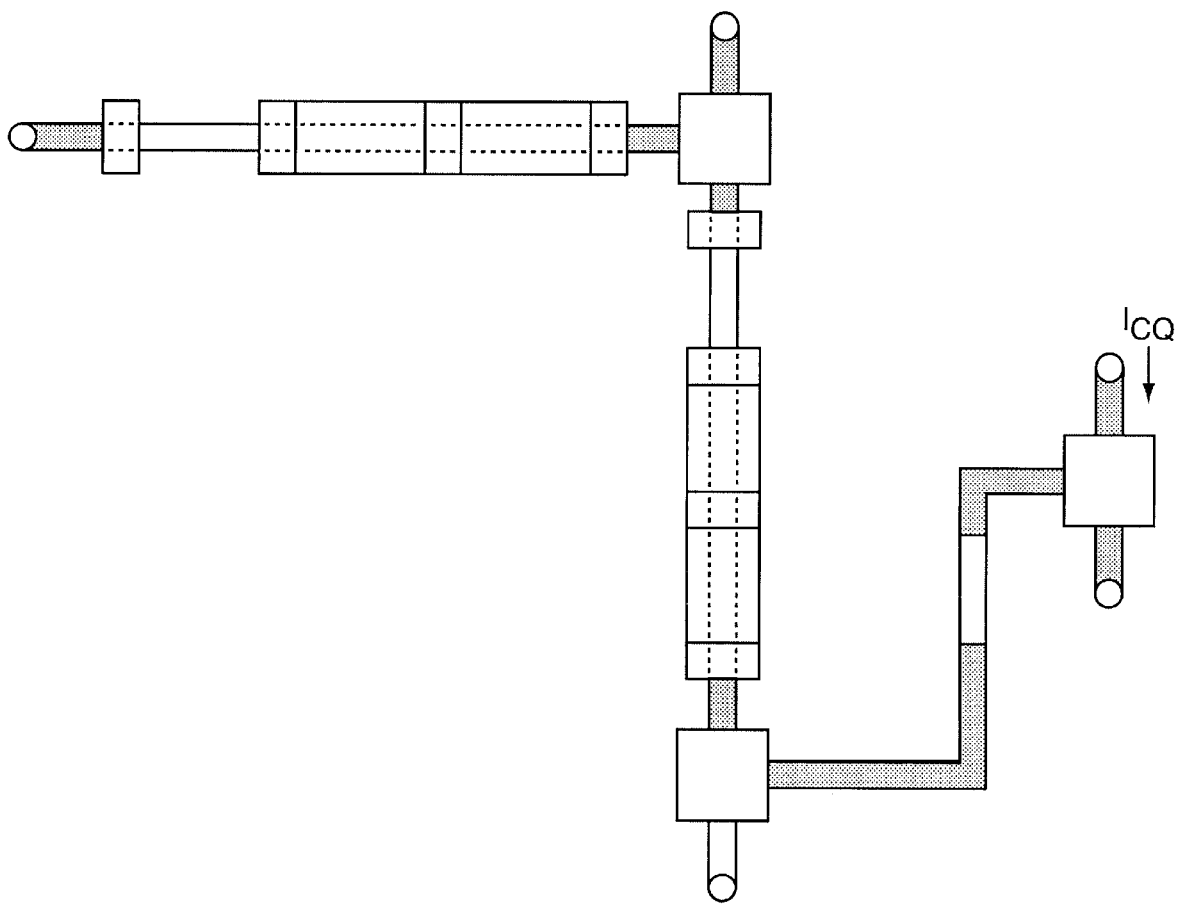
FIG. 6 shows a modification of the representation of FIG. 5 according to a first exemplary embodiment.

FIG. 6 depicts a configuration for a medium beta wafer, wherein resistive elements R1" and R1''' are shorted to provide an overall resistance value for R1 equal to that of resistive element R1'. The overall resistance value for R2 is equal to the resistive element value R2' because resistive elements R2" and R2''' are shorted out of the circuit. Those skilled in the art should recognize that any combination of these resistive elements may be used to further define ranges in addition to the three discussed in the exemplary embodiment. Once the circuit is modified by connecting the taps as described above (block 106), the semiconductor processing is finalized (block 108) to provide a semiconductor device that is compensated for beta variation.

Figure 8:
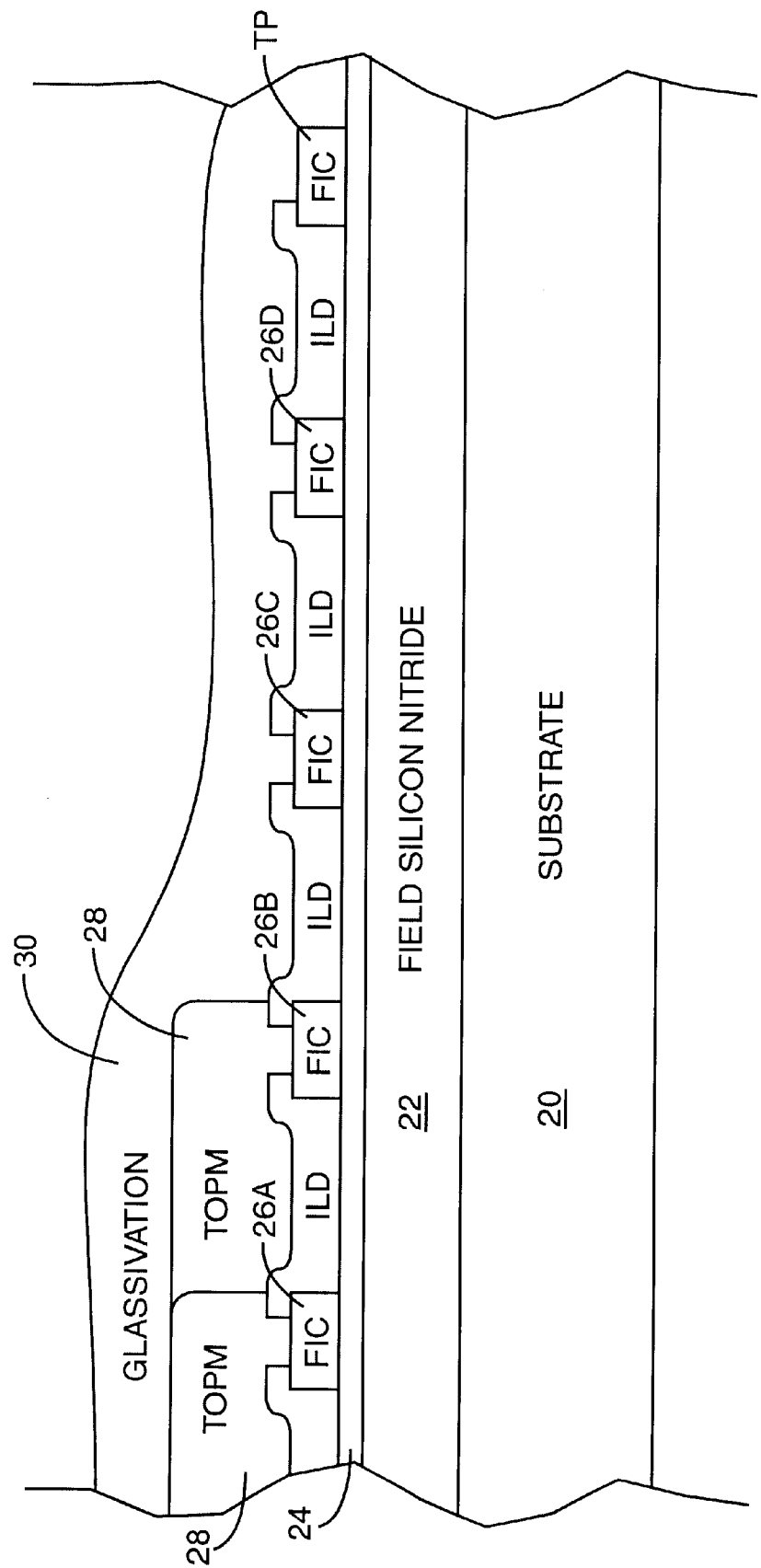
FIG. 8 is a cross-sectional representation of a semiconductor manufactured according to the preferred embodiment of the present invention.

Turning now to FIG. 8, a cross-sectional representation of a semiconductor configured according to the present invention is shown. The cross-section depicts the semiconductor substrate 20, upon which is layered a field silicon nitride layer 22, upon which is formed a resistive layer 24 formed of nickel chromium (NiCr). Taps 26A through 26D are placed on the resistive layer 24 in the first interconnect layer. These taps could correspond to any one of the taps TP1 through TP4 or TP5 through TP8 as shown in FIG. 4. Between these taps 26A through 26D is deposited an interlayer dielectric between the taps of the first interconnect layer (FIC) and above the resistive layer 24. Resistive elements are formed between taps 26A through 26D, which may be connected to each other or to other elements on the semiconductor using a top metal mask 28.

As depicted, the top metal mask entering the left of the diagram is connected to the far left tap 26A. Additional top metal is used to short tap 26A to tap 26B to provide a short between these taps. The top metal mask may be configured as necessary to short any one or more of the taps 26A through 26D to one another or to other circuit elements. Thus, depending on the measured beta, a corresponding top metal mask is selected to connect the various taps in order to configure the circuit to compensate for variations in beta. Preferably, each of the low, medium and high beta wafers have corresponding top metal masks configured to make circuit connections to compensate for beta and to adjust resistor values to keep bias currents, gain, and other performance parameters within a predefined range.

Although the preferred embodiment is directed to compensating for beta in gallium arsenide hetero-junction bipolar transistor devices, those of ordinary skill in the art will quickly recognize the application of the inventive process in a variety of semiconductor design and fabrication processes. Virtually any variable caused by the materials used to make the semiconductor or by the process in which the semiconductor is made may be compensated for with the adaptive manufacturing process of the present invention.

Based on in-process measurements, the final semiconductor design implemented in the semiconductor device may be modified during processing to adjust resistance, inductance and capacitance values alone or in combination with one another to insure the device operates according to predefined performance requirements. Characteristics such as gain, linearity, efficiency and impedance can be modified by simply implementing a base portion of the design, electrically testing the design in-process, and modifying the design in a subsequent processing step to compensate for any material or processing variables or deficiencies. The invention is applicable to any semiconductive fabrication process, such as silicon and gallium arsenide processes. The process is especially applicable in the manufacture of semiconductors incorporating highly variable materials. Further, the amount of material that would normally be unacceptable may be compensated for and used to manufacture semiconductors within the desired performance requirements.

Those of ordinary skill in the art will recognize various modifications to the above process. These variations and modifications are considered within the scope of the disclosure and the claims that follow.

What is claimed is:

1. An adaptive semiconductor manufacturing process comprising the steps of:
   a) initiating fabrication of a semiconductor device incorporating a circuit design;
   b) during fabrication, testing operation of the circuit design;
   c) based on the testing step, determining a parameter of the circuit design that is a function of the manufacturing process;

d) modifying the circuit design based on the parameter; and e) finalizing fabrication of the semiconductor device.

2. The process of claim 1 wherein the testing step includes electrically testing at least a portion of the circuit design and taking measurements from which the parameter may be determined.

3. The process of claim 1 wherein the modifying step includes selectively making at least one connection within the circuit design based on the parameter.

4. The process of claim 1 wherein the modifying step includes selectively adding components to the circuit design based on the parameter.

5. The process of claim 1 wherein the modifying step includes selectively removing components from the circuit design based on the parameter.

6. A semiconductor made using the process of claim 1 and comprising the circuit design.

7. An adaptive semiconductor manufacturing process comprising the steps of:
   a) designing a semiconductor having a design with an operational characteristic subject to variations imposed by materials used to manufacture the semiconductor or the manufacturing process itself and at least one modification to the design;
   b) during fabrication, electrically testing operation of at least a portion of the design; and
   c) during fabrication, modifying the design to include the at least one modification as necessary to ensure the operational characteristics of the design will fall within a predefined range.

8. An adaptive semiconductor manufacturing process comprising the steps of:
   a) initiating fabrication of a design in a semiconductor having a plurality of selectable configurations wherein each configuration corresponds to a variation in a parameter value imposed by materials used to manufacture the semiconductor or by the manufacturing process itself;
   b) during fabrication, testing a portion of the design bearing on the parameter value;
   c) during fabrication, selecting one of the configurations to implement in the semiconductor; and
   d) implementing the selected configuration of the design in the semiconductor.

9. The process of claim 8 wherein the parameter is beta and the testing step is designed to facilitate a determination beta.

10. The process of claim 8 wherein the selecting step includes determining components to connect or bypass in order to implement the selected configuration.

11. The process of claim 8 wherein the design having the selectable configurations is implemented in first semiconductor layers and the selected configuration is implemented by applying at least one additional semiconductor layer to the first semiconductor layers.

12. The process of claim 8 wherein the semiconductor manufacturing process is a gallium arsenide process, the design is an amplifier design incorporating a hetero-junction bipolar transistor, and the parameter value corresponds to beta for the hetero-junction bipolar transistor.

13. The process of claim 12 wherein the implementing step effectively shorts resistive elements in the design as necessary to incorporate the selected bonfiguration.

14. The process of claim 13 wherein there are a plurality of anticipated beta ranges for the hetero-junction bipolar transistor and each beta range corresponds to one of the selectable configurations.

15. The process of claim 8 wherein the initial fabricating step includes forming first interconnects for each of the selectable configurations and forming an inter-layer dielectric between certain of the first interconnects, and the implementing step includes forming top metal layer connecting select ones of the certain first interconnects to implement the selected configuration.

16. The process of claim 8 wherein the selectable configurations provide for incorporating or bypassing at least one of the group consisting of resistors, capacitors and inductors.

17. The process of claim 8 wherein the semiconductor manufacturing process is finalized.

18. A semiconductor made from the process of claim 8 and comprising the design.

19. A semiconductor manufacturing process for compensating for variations in beta for hetero-junction bipolar transistors, the process comprising the steps of:
   a) forming a semiconductor with a circuit having a hetero-junction bipolar transistor, a resistive element coupled to a base of the transistor, and a plurality of metallic interconnects couple to and spaced along the resistive element;
   b) testing at least a portion of the circuit to determine a beta value associated with the transistor; and
   c) selectively shorting pairs of the plurality of interconnects to change the effective resistance coupled to the base of the transistor based on the determined beta value.

20. The process of claim 19 wherein the shorting step includes applying a top metal layer using a photomask to apply a metallic connection between said selected pairs of interconnects.

21. A semiconductor manufacturing process for compensating for variations in beta for hetero-junction bipolar transistors, the process comprising the steps of:
   a) forming a semiconductor with a circuit having a heterojunction bipolar transistor, a resistive element coupled to a base of the transistor, and a plurality of metallic interconnects coupled to and spaced along the resistive element;
   b) testing at least a portion of the circuit to determine a beta value associated with the transistor; and
   c) selectively coupling a circuit to one of the interconnects to change the effective resistance coupled to the base of the transistor based on the determined beta value.

22. The process of claim 21 wherein the shorting step includes applying a top metal layer using a photomask to apply a metallic connection between the circuit and the selected interconnect.

* * * * *